United States Patent
Dudek

(10) Patent No.: US 10,074,540 B2
(45) Date of Patent: Sep. 11, 2018

(54) III-V SEMICONDUCTOR DIODE

(71) Applicant: 3-5 Power Electronics GmbH, Dresden (DE)

(72) Inventor: Volker Dudek, Ettlingen (DE)

(73) Assignee: 3-5 Power Electronics GmbH, Dresden (DE)

( * ) Notice: Subject to any disclaimer, the term of this patent is extended or adjusted under 35 U.S.C. 154(b) by 0 days.

(21) Appl. No.: 15/812,416

(22) Filed: Nov. 14, 2017

(65) Prior Publication Data

US 2018/0138043 A1     May 17, 2018

(30) Foreign Application Priority Data

Nov. 14, 2016  (DE) .......................... 10 2016 013 541

(51) Int. Cl.
*H01L 29/66* (2006.01)
*H01L 21/18* (2006.01)
(Continued)

(52) U.S. Cl.
CPC .......... *H01L 21/187* (2013.01); *H01L 21/185* (2013.01); *H01L 29/0657* (2013.01);
(Continued)

(58) Field of Classification Search
CPC ............... H01L 21/30; H01L 29/66204; H01L 29/0657; H01L 29/861; H01L 29/207; H01L 29/36; H01L 29/872
See application file for complete search history.

(56) References Cited

U.S. PATENT DOCUMENTS 3,958,265 A  *  5/1976  Charmakadze ..... H01L 33/0025
                                                 117/56
4,008,485 A  *  2/1977  Miyoshi ............. H01L 33/0008
                                                 257/101
(Continued)

FOREIGN PATENT DOCUMENTS

CN            203118957 U     8/2013
DE      10 2015 208 097 A1    11/2016

OTHER PUBLICATIONS

German Ashkinazi, "GaAs Power Devices", ISBN-954-7094-19-4, pp. 8 and 9.
(Continued)

*Primary Examiner* — Kyoung Lee
*Assistant Examiner* — Christina Sylvia
(74) *Attorney, Agent, or Firm* — Muncy, Geissler, Olds & Lowe, P.C.

(57) ABSTRACT

A stacked III-V semiconductor diode having a $p^+$ substrate with a dopant concentration of $5*10^{18}$ to $5*10^{20}$ cm$^{-3}$, a layer thickness of 50-500 μm, and formed of a GaAs compound, an $n^-$-layer with a dopant concentration of $10^{14}$-$10^{16}$ cm$^{-3}$, a layer thickness of 10-300 μm, and formed of a GaAs compound, an $n^+$ layer with a dopant concentration of at least $10^{19}$ cm$^{-3}$, a layer thickness less than 2 μm and formed of a GaAs compound, wherein the $n^-$ layer and the $n^+$ layer are materially connected to one another, a doped intermediate layer with a layer thickness of 5-50 μm and a dopant concentration of $10^{15}$-$10^{17}$ cm$^{-3}$ is placed between the $p^+$ substrate and the $n^-$ layer, and the intermediate layer is materially connected to the $p^+$ substrate and to the $n^-$ layer.

14 Claims, 1 Drawing Sheet

(51) Int. Cl.
*H01L 29/872* (2006.01)
*H01L 29/207* (2006.01)
*H01L 29/36* (2006.01)
*H01L 29/861* (2006.01)
*H01L 29/06* (2006.01)

(52) U.S. Cl.
CPC ............ *H01L 29/207* (2013.01); *H01L 29/36* (2013.01); *H01L 29/66204* (2013.01); *H01L 29/861* (2013.01); *H01L 29/872* (2013.01)

(56) References Cited

U.S. PATENT DOCUMENTS

| | | | |
|---|---|---|---|
| 5,622,877 A | * | 4/1997 | Ashkinazi ......... H01L 29/66212 117/68 |
| 5,733,815 A | | 3/1998 | Ashkinazi et al. |
| 9,647,083 B2 | | 5/2017 | Schloegl et al. |

OTHER PUBLICATIONS

Bhojani et al., "Gallium arsenide semiconductor parameters extracted from pin diode measurements and simulations," IET Power Electronics, vol. 9, No. 4, pp. 689-697 (Mar. 30, 2016).

* cited by examiner

III-V SEMICONDUCTOR DIODE

This nonprovisional application claims priority under 35 U.S.C. § 119(a) to German Patent Application No. 10 2016 013 541.7, which was filed in Germany on Nov. 14, 2016, and which is herein incorporated by reference.

BACKGROUND OF THE INVENTION

Field of the Invention

The invention relates to a III-V semiconductor diode.

Description of the Background Art

A high-voltage-resistant $p^+$-n-$n^+$ semiconductor diode is known from "GaAs Power Devices" by German Ashkinazi, ISBN 965-7094-19-4, pp. 8 and 9.

SUMMARY OF THE INVENTION

It is therefore an object of the invention to provide a device that refines the prior art.

According to an exemplary embodiment of the invention, a stacked III-V semiconductor diode is provided having a $p^+$ substrate with a dopant concentration of $5*10^{18}$ to $5*10^{20}$ cm$^{-3}$ and a layer thickness between 50 µm and 500 µm, wherein the $p^+$ substrate comprises a GaAs compound or consists of a GaAs compound.

Further, the III-V semiconductor diode has an $n^-$ layer with a dopant concentration of $10^{14}$-$10^{16}$ cm$^{-3}$ and a layer thickness of 10-300 µm as well as an $n^+$ layer with a dopant concentration of at least $5*10^{19}$ cm$^{-3}$ and a layer thickness of less than 30 µm, wherein the $n^-$ layer and the $n^+$ layer comprise a GaAs compound or consist of a GaAs compound and are materially connected to one another.

A doped intermediate layer with a layer thickness of 1-50 µm and a dopant concentration of $10^{12}$-$10^{17}$ cm$^{-3}$ is placed between the $p^+$ substrate and the $n^-$ layer, wherein the intermediate layer is materially connected to the $p^+$ substrate and to the $n^-$ layer.

The intermediate layer can have at least a different dopant concentration compared with the materially bonded layers.

An advantage is that, with the III-V semiconductor diode of the invention, it is possible in a simple way to produce blocking voltages in a range of 200 V to 3300 V with smaller on-resistances and smaller capacitances per unit area than is the case with conventional high-blocking diodes made of Si or SiC. As a result, switching frequencies from 30 kHz to 0.5 GHz and current densities of 0.5 A/mm² to 5 A/mm² can be achieved.

A further advantage is that the III-V semiconductor diodes can be manufactured more cost-effectively than comparable high-blocking diodes made of SiC.

In particular, the III-V semiconductor diodes of the invention can be used as freewheeling diodes.

It should be noted that in the present case the III-V semiconductor diodes of the invention have low on-resistances in a range between 1 mOhm and 200 mOhm. The capacitances per unit area are in a range between 2 pF and 100 pF.

A further advantage of the III-V semiconductor diode of the invention is a high temperature resistance of up to 300° C. In other words, the III-V semiconductor diodes can also be used in hot environments.

In a first embodiment, the intermediate layer is p-doped and, according to alternative refinements, comprises zinc and/or silicon as dopants. The dopant concentration of the intermediate layer is less than the dopant concentration of the $p^+$ substrate. Preferably, the dopant concentration is smaller in a range between a factor of 2 to a factor of 100,000, i.e., by five magnitudes.

In a further embodiment, the intermediate layer is n-doped and preferably comprises silicon as the dopant. The dopant concentration of the intermediate layer is less than the dopant concentration of the $n^-$ region. Preferably, the dopant concentration is smaller in a range up to a factor of 100.

In a further embodiment, the $p^+$ substrate comprises zinc as the dopant. In a further embodiment, the $n^-$ layer and/or the $n^+$ layer preferably comprise silicon and/or chromium and/or palladium and/or tin.

In a further embodiment, the stacked layer structure, consisting of the $p^+$ substrate, the intermediate layer, the $n^-$ layer, and the $n^+$ layer, is formed monolithically.

In a further embodiment, a total height of the stacked layer structure, consisting of the $p^+$ substrate, the intermediate layer, the $n^-$ layer, and the $n^+$ layer, is at most 150-500 µm.

Preferably, a surface of the layer structure is quadrangular, in particular rectangular or square, and has an edge length in a range between 1 mm and 20 mm. In a refinement, the quadrangular structures each have rounded edges and/or corners in order to avoid field strength peaks, in particular at voltages above 500 V.

In a further embodiment, the surface is round. As a result, field strength excesses are particularly effectively reduced. Preferably, the surface is circular or oval.

In an embodiment, the stacked layer structure, formed of the p– layer, the n– layer, and the n+ layer, has a semiconductor bond formed between the n– layer and the p– layer. It should be noted that the term 'semiconductor bond' can be used synonymously with the term 'wafer bond'. The layer structure has a first partial stack, comprising the p– layer, and a second partial stack, comprising the n+ layer and the p– layer. The first partial stack and the second partial stack are each formed monolithically.

The p– layer can have a doping of less than 1013 N/cm–3 or a doping between 1013 N/cm–3 and 1015 N/cm–3. In an embodiment, the p– layer is thinned before or after the bonding by a grinding process to a thickness between 10 µm and 300 µm.

In an embodiment, a first partial stack is provided, wherein the first partial stack comprises the p– layer, and further a second stack is provided, wherein the second partial stack comprises the n– layer and the n+ layer, and the first partial stack is connected to the second stack by a wafer bonding process.

In an embodiment, the second stack is formed in which the n– layer can be formed proceeding from an n– substrate; in this case the n– substrate or the n– layer will be or is connected to the second stack by a wafer bonding process. In a further process step, the n– substrate or the n– layer is thinned to the desired thickness. For example, the thickness of the n– layer is within a range between 50 µm and 250 µm. The doping of the n– layer can be in a range between 1013 N/cm–3 and 1015 N/cm–3. An advantage of the wafer bonding is that thick n– layers can be easily produced. A longer deposition process during epitaxy is not necessary as a result. The number of stacking errors can also be reduced by means of the bonding.

In an embodiment, the n− layer has a doping greater than 1010 N/cm−3 and less than 1013 N/cm−3. Because the doping is extremely low, the n− layer can also be understood as an intrinsic layer.

In an embodiment, after the thinning of the n− substrate or the n− layer by epitaxy or high-dose implantation, the n+ layer is produced on the n− substrate or the p− layer in a range between 1018 N/cm−3 and less than 5×1019 N/cm−3. The thinning of the n− substrate or the n− layer occurs for example by means of a CMP step, i.e., by means of chemical mechanical polishing.

In an embodiment, an auxiliary layer is deposited on the front side of the diode structure. The rear side of the diode structure can then be thinned and placed on a carrier. In an embodiment, the front side is then removed.

In an embodiment, the surface of the n+ layer and the surface of the p− layer are metallized in order to form and electrically connect the Schottky diode. Preferably, the cathode of the semiconductor diode is materially connected to a base formed as a heat sink after the metallization. In other words, the anode is formed on the surface of the diode on the p− layer.

Tests have shown that different blocking voltages can be achieved with specific combinations of a p− intermediate layer and n− layer.

In a first embodiment, the p− intermediate layer comprises: a thickness between 10 μm and 25 μm and a thickness between 40 μm and 90 μm for the n− layer results in a blocking voltage of about 900 V.

In a second embodiment, the p− intermediate layer comprises: a thickness between 25 μm and 35 μm and a thickness between 40 μm and 70 μm for the n− layer results in a blocking voltage of about 1200 V.

In a third embodiment, the p− intermediate layer comprises: a thickness between 35 μm and 50 μm and a thickness between 70 μm and 150 μm for the n− layer results in a blocking voltage of about 1500 V.

The diodes described above in the first to third embodiments can be also be designated as punch-through diodes in regard to the formation of the space charge regions.

In a fourth embodiment, the p− intermediate layer comprises: a thickness between 10 μm and 25 μm and a thickness between 60 μm and 110 μm for the n− layer.

In a fifth embodiment, the p− intermediate layer comprises: a thickness between 10 μm and 25 μm and a thickness between 70 μm and 140 μm for the n− layer.

In a sixth embodiment, the p− intermediate layer comprises: a thickness between 35 μm and 50 μm and a thickness between 80 μm and 200 μm for the n− layer.

The diodes described above in the fourth to sixth embodiments can also be designated as "non-reach-through" diodes in regard to the formation of space charge regions.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
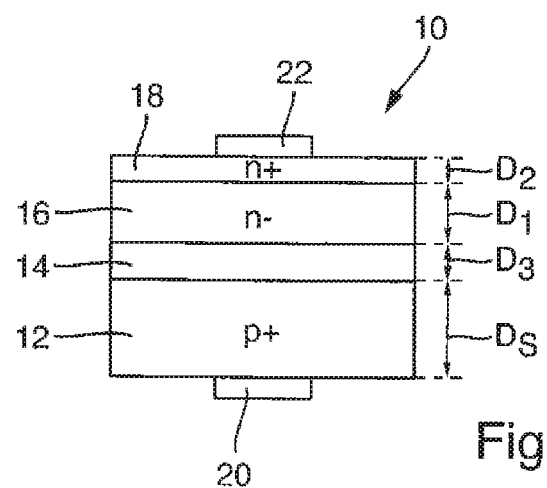
FIG. 1 is a view of an embodiment of the invention of a III-V semiconductor diode.

The illustration in FIG. 1 shows a view of a first embodiment of a stacked III-V semiconductor diode 10 of the invention, having a $p^+$ substrate 12, an intermediate layer 14 materially connected to $p^+$ substrate 12, an $n^-$ layer 16 materially connected to intermediate layer 14, an $n^+$ layer 18 materially connected to $n^-$ layer 16, and a first contact 20 and a second contact 22. First contact 20 is materially connected to a bottom side of $p^+$ substrate 12, whereas second contact 22 is materially connected to a top side of $n^+$ layer 18.

The $p^+$ substrate 12 comprises a GaAs compound, is p-doped, and has a dopant concentration of $10^{19}$ cm$^{-3}$. A layer thickness $D_s$ of $p^+$ substrate 12 is between 50 μm and 500 μm.

Intermediate layer 14 has a layer thickness $D_3$ of 1-50 μm and a doping with a dopant concentration of $10^{12}$-$10^{17}$ cm$^{-3}$.

The $n^-$ layer 16 is slightly n-doped with a dopant concentration of $10^{12}$-$10^{16}$ cm$^{-3}$ and has a layer thickness $D_1$ of 10-300 μm.

The $n^+$ layer 18 is highly n-doped with a dopant concentration of at least $10^{19}$ cm$^{-3}$ and a layer thickness $D_2$ smaller than 30 μm.

Figure 2:
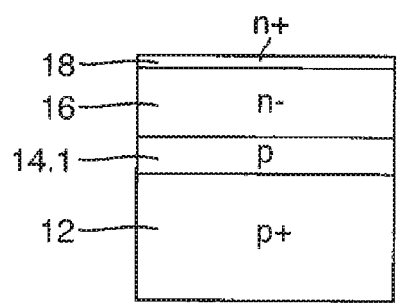
FIG. 2 shows a view of an embodiment of the invention of a layer sequence.
Figure 3:
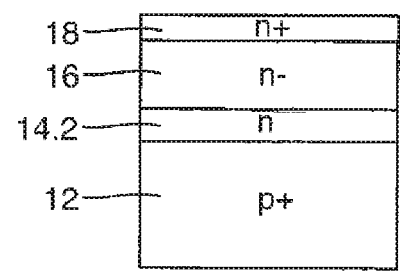
FIG. 3 shows a view of an embodiment of the invention of a layer sequence.

Two alternative embodiments of a layer structure 100 of a III-V semiconductor diode of the invention, said structure consisting of $p^+$ substrate 12, $n^-$ layer 16, intermediate layer 14, and $n^+$ layer 18, are shown in the illustrations in FIGS. 2 and 3. Only the differences from the illustration in FIG. 1 will be explained below.

In a first embodiment, layer structure 100 can have a slightly p-doped intermediate layer 14.1, as shown in FIG. 2. Alternatively, the layer sequence has a slightly n-doped intermediate layer 14.2, as shown in FIG. 3.

Figure 4:
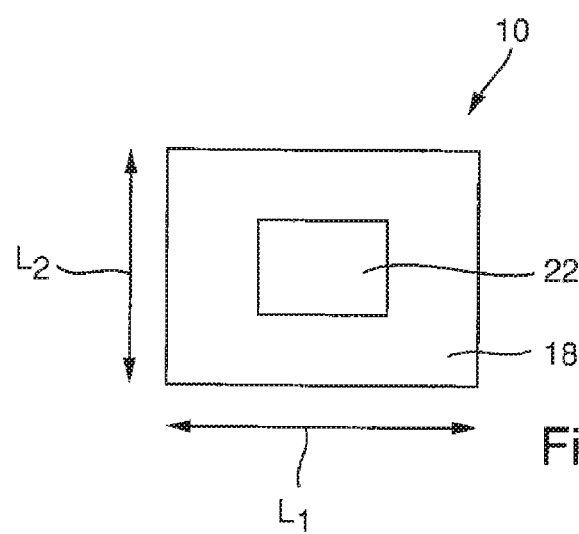
FIG. 4 shows a plan view of the III-V semiconductor diode from FIG. 1.

A plan view of the first embodiment of a III-V semiconductor diode of the invention, shown in FIG. 1, is illustrated in the diagram in FIG. 4. Only the differences from the illustration in FIG. 1 will be explained below.

Stacked layer structure 100 of III-V semiconductor diode 10, consisting of $p^+$ substrate 12, $n^-$ layer 16, intermediate layer 14, and $n^+$ layer 18, has a rectangular perimeter and as a result also a rectangular surface with edge lengths L1 and L2. Contact surface 22 disposed on the surface of layer sequence 100 covers only part of the surface.

It is understood that, in an embodiment the stack also can have a quadrangular surface. In particular, the surface is square.

In a further embodiment the corners can be rounded in the angular designs in order to avoid field strength peaks at high voltages.

In a further embodiment, the surface is round. As a result, field strength excesses are particularly effectively reduced. Preferably, the surface is circular or oval.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A stacked III-V semiconductor diode comprising:
a $p^+$ substrate with a dopant concentration of $5*10^{18}$ to $5*10^{20}$ cm$^{-3}$, a layer thickness of 50-500 µm, the $p^+$ substrate comprising a GaAs compound;
an $n^-$ layer with a dopant concentration of $10^{12}$-$10^{16}$ cm$^{-3}$, a layer thickness of 10-300 µm, the n-layer comprising a GaAs compound;
an $n^+$ layer with a dopant concentration of at least $10^{19}$ cm$^{-3}$, a layer thickness less than 30 µm, the $n^+$ layer comprising a GaAs compound, the $n^-$ layer and the $n^+$ layer being materially connected to one another; and
a doped intermediate layer with a layer thickness of 1 µm to 50 µm and a dopant concentration of $10^{12}$-$10^{17}$ cm$^{-3}$ is placed between the $p^+$ substrate and the $n^-$ layer, the doped intermediate layer being materially connected to the $p^+$ substrate and to the $n^-$ layer.

2. The III-V semiconductor diode according to claim 1, wherein the intermediate layer is p-doped.

3. The III-V semiconductor diode according to claim 2, wherein the dopant concentration of the doped intermediate layer is less than the dopant concentration of the $p^+$ substrate and is smaller in a range between a factor of 2 up to a factor of 5 orders of magnitude.

4. The III-V semiconductor diode according to claim 2, wherein the doped intermediate layer comprises zinc or silicon.

5. The III-V semiconductor diode according to claim 1, wherein the doped intermediate layer is n-doped.

6. The III-V semiconductor diode according to claim 5, wherein the dopant concentration of the doped intermediate layer is less than the dopant concentration of the $n^-$ region by a factor of up to 100.

7. The III-V semiconductor diode according to claim 1, wherein the doped intermediate layer comprises silicon and/or zinc.

8. The III-V semiconductor diode according to claim 1, wherein the $p^+$ substrate comprises zinc.

9. The III-V semiconductor diode according to claim 1, wherein the $n^-$ layer and/or the $n^+$ layer comprise silicon and/or chromium and/or palladium and/or tin.

10. The III-V semiconductor diode according to claim 1, wherein a stacked layer structure comprising the $p^+$ substrate, the $n^-$ layer, the doped intermediate layer, and the $n^+$ layer, is formed monolithically.

11. The III-V semiconductor diode according to claim 1, wherein a total height of a stacked layer structure comprising the $p^+$ substrate, the $n^-$ layer, the doped intermediate layer, and the $n^+$ layer is at most 150-500 µm.

12. The III-V semiconductor diode according to claim 1, wherein the stacked layer structure comprising the $p^+$ substrate, the $n^-$ layer, the doped intermediate layer, and the $n^+$ layer has a rectangular or square surface with edge lengths between 1 mm and 10 mm.

13. The III-V semiconductor diode according to claim 1, wherein the stacked layer structure comprising the $p^+$ substrate, the $n^-$ layer, the doped intermediate layer, and the $n^+$ layer, has a round, oval, or circular surface.

14. The III-V semiconductor diode according to claim 1, wherein a first partial stack is provided, wherein the doped intermediate layer is grown from the $p^+$ substrate via epitaxy, wherein a second stack is provided, wherein the second partial stack comprises a $n^-$ layer, and wherein the $n^-$ layer is connected to the second stack by a wafer bonding process.

* * * * *